United States Patent
Chevallier

[11] Patent Number: 5,994,928
[45] Date of Patent: Nov. 30, 1999

[54] RAPIDLY CHARGED SAMPLE-AND HOLD CIRCUIT

[75] Inventor: Gilles Chevallier, Langrune Sur Mer, France

[73] Assignee: U.S. Philips Corporation, New York, N.Y.

[21] Appl. No.: 09/083,221

[22] Filed: May 22, 1998

[30] Foreign Application Priority Data

Jul. 11, 1997 [FR] France ................................ 9708893

[51] Int. Cl.$^6$ .............................................. G11C 27/02
[52] U.S. Cl. ............................................. 327/95; 327/96
[58] Field of Search ............................. 327/91, 94, 95, 327/96, 337, 554; 341/122

[56] References Cited

U.S. PATENT DOCUMENTS

| | | | |
|---|---|---|---|
| 4,529,965 | 7/1985 | Lee | 341/122 |
| 4,894,620 | 1/1990 | Nagaraj | 327/91 |
| 4,962,325 | 10/1990 | Miller et al. | 327/95 |
| 5,015,877 | 5/1991 | King | 327/94 |
| 5,376,891 | 12/1994 | Kirchlechner | 327/337 |
| 5,689,201 | 11/1997 | Temes et al. | 327/96 |

Primary Examiner—Timothy P. Callahan
Assistant Examiner—Terry L. Englund
Attorney, Agent, or Firm—Brian J. Wieghaus

[57] ABSTRACT

A comparator (22) compares the output signal (Vout) supplied by an output amplifier (21) with an input signal (Vin). Dependent on the result of the comparison, it controls the conduction of one or the other of two sources (IGA, IGB) which supply opposite currents. Two complementary assemblies (A, B) each comprise a first transistor (T1A, T1B) and a second transistor (T2A, T2B). Each first transistor (T1A, T1B) has its base controlled by one of the current sources for charging a first capacitance (C1) connected to the output, and also controls the conduction of the corresponding second transistor. The bases of the second transistors (T2A, T2B) are jointly connected to the first capacitance (C1) and their emitters are jointly connected to the negative input of the output amplifier (21). The negative input of the output amplifier (21) is also connected to a reference voltage (Vref) via a resistor (20) and to the output (Vout) via a second capacitance (C2).

5 Claims, 1 Drawing Sheet

RAPIDLY CHARGED SAMPLE-AND HOLD CIRCUIT

The invention relates to an integrated circuit including a sample-and-hold circuit intended to receive an input signal and supply an output signal, the sample-and-hold circuit comprising a first and a second capacitance, a first plate of each capacitance being connected to the output of an output amplifier which constitutes the output of the sample-and-hold circuit, a connection being provided between the second plate of the first capacitance and the "−" input of the output amplifier, the second plate of the second capacitance being connected to this input.

Such a sample-and-hold circuit is used in association with other circuits, for example, an A/D converter whose speed can be improved by this circuit.

A sample-and-hold circuit as described in the opening paragraph is known from the document U.S. Pat. No. 5,015,877. The sample-and-hold circuit described in this document also comprises a transconductance input amplifier, an "S/H/signal amplifier which controls a switch, as well as an amplifier for charging the second capacitance from the input amplifier current, while the second plates of the two capacitances are interconnected by means of a resistor.

It is an object of the invention to provide a simpler sample-and-hold circuit which offers a good control flexibility.

To this end, the sample-and-hold circuit comprises a comparator arrangement for comparing the output signal with the input signal, which arrangement supplies, during comparison phases, a current of a predetermined value in one or the other direction, dependent on the comparison direction, and a device for rapidly charging the first capacitance from a power supply terminal when a current is furnished by the arrangement, and for passing substantially the entire current of the arrangement through the second capacitance, and for jointly connecting the two capacitances to the input of the output amplifier when no current is furnished by the arrangement.

The invention is thus based, inter alia, on the idea of controlling the charge current of the capacitances by means of a comparator between the output voltage and the input voltage, which allows a simplification of the charge and discharge circuits of the capacitances.

In a particular embodiment, the comparator arrangement is constituted by a comparator having two complementary outputs which, dependent on the direction of comparison between the signals applied to its input, control the conduction of one or the other of the two current sources which supply opposite currents.

Advantageously, for rapidly charging the first capacitance, the device comprises two complementary assemblies each corresponding to one of the current directions of the comparator arrangement, and each assembly comprises a first transistor whose base is powered by this current and whose collector is connected to a corresponding power supply terminal, the emitters of the first transistors of the two assemblies being jointly connected to the second plate of the first capacitance.

The first capacitance can thus be charged very rapidly.

Advantageously, each assembly comprises a second transistor whose base is connected to the emitter of the first transistor and whose collector is connected to the base of the first transistor, the emitters of the second transistors of the two assemblies being jointly connected to the input of the output amplifier, which input is connected to a reference voltage via a resistor, as well as to the second plate of the second capacitance.

The connection between the first and the second capacitance is thus controlled and hence more efficient.

In a particularly advantageous application, the sample-and-hold circuit is used for shaping the input signal of an A/D converter.

These and other aspects of the invention are apparent from and will be elucidated with reference to the embodiments described hereinafter.

Figure 1:
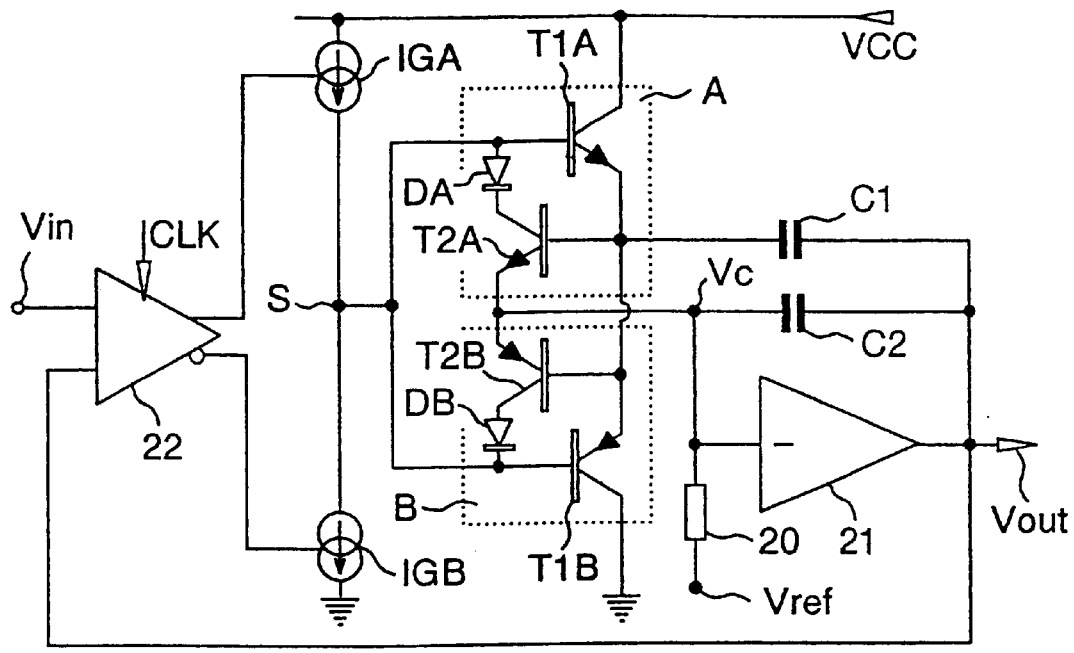
FIG. 1 is a diagram of a sample-and-hold circuit according to the invention.

The sample-and-hold circuit of FIG. 1 has an input terminal Vin and an output terminal Vout. A comparator 22 compares the output signal Vout with the input signal Vin. It has two complementary outputs, i.e. supplying two complementary signals which, at instants controlled by a clock CLK, control the conduction of one or the other of the two current sources IGA and IGB, dependent on the direction of comparison between the signals Vin and Vout. The source IGA introduces a current having the value IGA in a node S, and the source IGB extracts a current having the value IGB from this node S. The assembly of comparator and sources IGA, IGB constitutes the above-mentioned comparator arrangement.

From the node S, a device controls the voltage of a node Vc connected to the negative input of an output amplifier 21 whose output constitutes the output Vout of the sample-and-hold circuit. This amplifier 21 has a finite negative gain of an absolute value $\beta$.

This device comprises two complementary assemblies. One assembly A comprises a first transistor T1A and a second transistor T2A of the NPN type, and the other assembly B comprises a first transistor T1B and a second transistor T2B of the PNP type. In each of these assemblies, the base of the first transistor T1A or T1B is connected to the node S, its collector is connected to a power supply source VCC and ground, respectively, and its emitter is connected to the base of the second transistor T2A or T2B whose collector is connected to the base of the first transistor via a diode DA or DB arranged in the forward direction of the main current of the second transistor.

A first plate of a capacitance C1 having a value C1, as well as a first plate of a capacitance C2 having a value C2 are connected to the output Vout.

The bases of the two second transistors T2A and T2B are jointly connected to the second plate of the capacitance C1.

The emitters of the two second transistors are jointly connected to:
 the negative input of the output amplifier 21,
 a reference voltage Vref via a resistor 20 having a value R20,
 the second plate of the capacitance C2.

The voltage Vref has a value which is approximately half that of the power supply voltage VCC.

The operation of the assembly A will now be described. The operation of the assembly B can be deduced mutatis mutandis: the two complementary assemblies play a homolog role, with either the source IGA or the source IGB supplying a current.

When the source IGA supplies a current, the transistor T1A is turned on and its main current from VCC rapidly charges the capacitance C1. Simultaneously, this current feeds the base of the transistor T2A; the current from the source IGA thus substantially entirely passes through the main path of the transistor T2A and charges the capacitance C2. When the source IGA is cut off, the capacitances C1 and C2 are interconnected via the base-emitter diode of the transistor T2A so as to be jointly discharged via the resistor 20.

The device makes use of an effect which is analog to that known as the "Miller effect", here concerning the amplifier 21: having flowed through T2A, the current from the source IGA is divided between the resistor 20 and the capacitance C2, supposing that the input current of the amplifier 21 is negligible. When the voltage increases at the node Vc, it decreases at the output Vout and the voltage Vout transmitted by the capacitances C1 and C2 prevents the voltage at Vc from rising as fast as it would do if the right-hand plate of C1 and C2 were connected to a fixed voltage. All this happens as if the value of the capacitances C1 and C2 were larger, which is not true. It is thus possible to use capacitances of a low value which can therefore be integrated. When a current IGA flows through T2A, the voltage develops at the input of the amplifier 21 with a rapidity which depends on the value of IGA, C2 and the gain β of the amplifier 21. When IGA disappears, the currents of T1A and T2A also disappear and the voltage develops at Vc with a time constant τ2=R20×β×(C1+C2).

Figure 2:
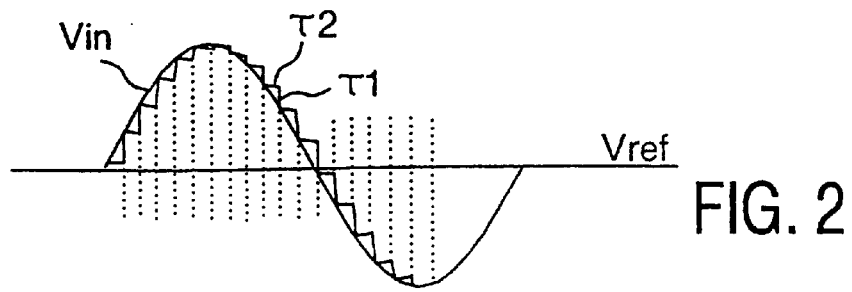
FIG. 2 is a voltage/time diagram illustrating its operation.

During a clock pulse, which triggers the arrival of a new sample, the voltage Vout rapidly changes from the old value to the new value and then develops, between two clock periods, to the voltage Vref with the relatively long time constant τ2. FIG. 2 illustrates this operation; voltage variations in each of the two situations are indicated by "τ1" and "τ2", respectively; the vertical dotted lines indicate the clock.

Figure 3:
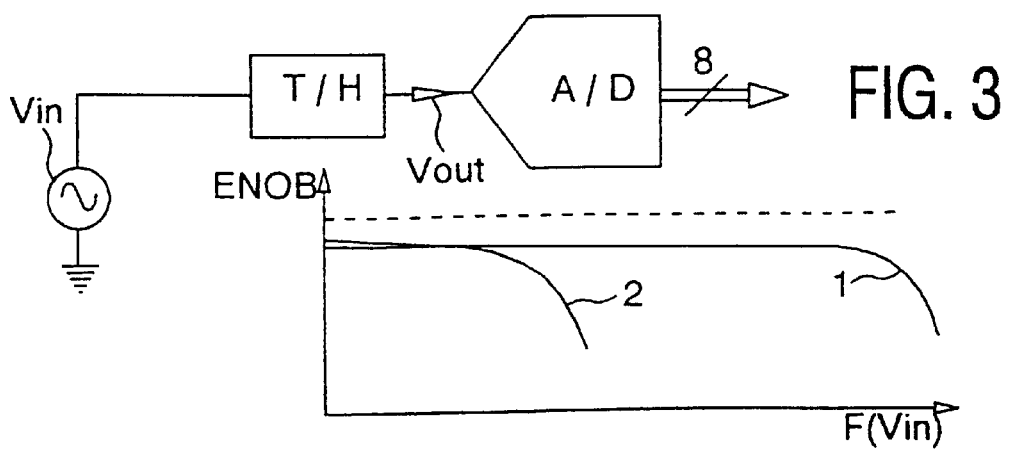
FIG. 3 illustrates an application of the sample-and-hold circuit.

In accordance with the example of application shown in FIG. 3, a sampler T/H, generally referred to as "Track-and-Hold" circuit precedes an A/D converter A/D which supplies a digital signal of eight bits representing, for example, a video signal. The curve under the diagram illustrates the advantage of this application. The effective precision of the output signal is plotted on the ordinate and expressed as an effective number of bits ENOB, while the frequency F(Vin) of the input signal is plotted on the abscissa. Curves 1 and 2 represent the result with and without the track-and-hold circuit T/H. With the track-and-hold circuit, the effective number of bits practically reaches the theoretical limit based on the Nyquist criterion.

I claim:

1. An integrated circuit including a sample-and-hold circuit that receives an input signal and supplies an output signal, the sample-and-hold circuit comprising:
   an output amplifier having a negative input and an output, the output of the output amplifier providing the output signal of the sample-and-hold circuit,
   a first capacitance and a second capacitance, a first plate of each capacitance being connected to the output of the output amplifier, the second plate of the second capacitance being connected to the negative input of the output amplifier,
   the sample-and-hold circuit further comprises:
     a comparator arrangement that compares the output signal with the input signal to produce an output current, and
     a device that, in dependence upon a magnitude of the output current, is configured to:
       rapidly charge the first capacitance from a select one of a pair of power supply terminals,
       pass a substantial portion of the output current of the comparator arrangement through the second capacitance, and
       connect the second plate of the first capacitance to the negative input of the output amplifier.

2. An integrated circuit as claimed in claim 1, characterized in that the comparator arrangement includes:
   a comparator that compares the output signal with the input signal and produces thereby two complementary outputs, and
   two current sources, each operably coupled to a corresponding one of the two complementary outputs, that are configured to provide the output current in dependence upon a direction of comparison between the output signal and the input signal.

3. An integrated circuit as claimed in claim 1, characterized in that, for rapidly charging the first capacitance,
   the device comprises two complementary assemblies, each of the two assemblies are coupled to receive the output current of the comparator arrangement, and
   each assembly of the two assemblies comprises a first transistor
     whose base is powered by the output current and
     whose collector is connected to a corresponding one of the pair of power supply terminals wherein,
   emitters of the first transistors of the two assemblies are jointly connected to the second plate of the first capacitance.

4. An integrated circuit as claimed in claim 3, characterized in that
   each of the two assemblies further comprises a second transistor
     whose base is connected to the emitters of the first transistors,
     whose collector is connected to the base of the corresponding first transistor, wherein
   emitters of the second transistors of the two assemblies are jointly connected to the negative input of the output amplifier, and
   the negative input of the output amplifier is further connected to a reference voltage via a resistor.

5. An integrated circuit as claimed in claim 1, further including
   an A/D converter that is operably coupled to the sample-and-hold circuit.

* * * * *